(12) United States Patent
Upendra et al.

(10) Patent No.: US 11,699,647 B2
(45) Date of Patent: Jul. 11, 2023

(54) PRE-MOLDED LEAD FRAMES FOR SEMICONDUCTOR PACKAGES

(71) Applicant: Infineon Technologies AG, Neubiberg (DE)

(72) Inventors: Balehithlu Manjappaiah Upendra, Singapore (SG); Romel Solanoy Lazala, Singapore (SG); Dexter Inciong Reynoso, Singapore (SG); Mohamad Yazid Bin Wagiman, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 51 days.

(21) Appl. No.: 17/231,083

(22) Filed: Apr. 15, 2021

(65) Prior Publication Data

US 2022/0336340 A1  Oct. 20, 2022

(51) Int. Cl.
*H01L 23/498* (2006.01)
*H01L 25/065* (2023.01)
*H01L 23/00* (2006.01)

(52) U.S. Cl.
CPC ........ *H01L 23/49866* (2013.01); *H01L 24/32* (2013.01); *H01L 24/48* (2013.01); *H01L 24/83* (2013.01); *H01L 25/0655* (2013.01); *H01L 2224/32225* (2013.01); *H01L 2224/48245* (2013.01)

(58) Field of Classification Search
CPC ... H01L 23/49866; H01L 24/32; H01L 24/48; H01L 24/83; H01L 25/0655; H01L 2224/32225; H01L 2224/48245
See application file for complete search history.

(56) References Cited

U.S. PATENT DOCUMENTS

| | | | |
|---|---|---|---|
| 2002/0076558 A1 | 6/2002 | Tomiyoshi et al. | |
| 2005/0103105 A1 | 5/2005 | Emmerich et al. | |
| 2009/0260226 A1* | 10/2009 | Tinguely | H03H 9/1021 29/739 |
| 2019/0355635 A1 | 11/2019 | Kimura | |

FOREIGN PATENT DOCUMENTS

| | | |
|---|---|---|
| DE | 4319786 | 12/1993 |
| JP | H08288428 | 11/1996 |
| JP | H10170380 | 6/1998 |
| JP | H11163180 | 6/1999 |

\* cited by examiner

*Primary Examiner* — Elias Ullah
(74) *Attorney, Agent, or Firm* — Dicke, Billig & Czaja, PLLC

(57) ABSTRACT

One example of a pre-molded lead frame includes a mold body, a plurality of recesses, and a plurality of first leads. The mold body includes a first main surface and a second main surface opposite to the first main surface. Each recess of the plurality of recesses extends from the first main surface into the mold body. The plurality of first leads are coupled to the mold body and extend from a third surface of the mold body. The third surface extends between the first main surface and the second main surface.

20 Claims, 18 Drawing Sheets

PRE-MOLDED LEAD FRAMES FOR SEMICONDUCTOR PACKAGES

BACKGROUND

In semiconductor packages including multiple die pads, adjacent die pads should be separated by a safe isolation distance. In addition, a semiconductor die attached to a die pad should meet a clearance requirement between each edge of the semiconductor die and the corresponding edge of the die pad. To satisfy both the safe isolation distance and the clearance requirement, the distance between adjacent semiconductor dies within a semiconductor package may be increased. Further, multiple die pad designs may be used to accommodate different semiconductor die designs and/or die attach materials. For a desired semiconductor package size, the above factors limit the maximum size of semiconductor dies that may be used within the semiconductor package.

For these and other reasons, a need exists for the present disclosure.

SUMMARY

One example of a pre-molded lead frame includes a mold body, a plurality of recesses, and a plurality of first leads. The mold body includes a first main surface and a second main surface opposite to the first main surface. Each recess of the plurality of recesses extends from the first main surface into the mold body. The plurality of first leads are coupled to the mold body and extend from a third surface of the mold body. The third surface extends between the first main surface and the second main surface.

One example of a semiconductor package includes a pre-molded lead frame, a first semiconductor die, a second semiconductor die, and a plurality of first electrical connections. The pre-molded lead frame includes a mold body including a first main surface and a second main surface opposite to the first main surface, at least two recesses within the mold body extending from the first main surface into the mold body, and a plurality of first leads coupled to the mold body. The first semiconductor die is attached to the mold body within a first recess of the at least two recesses by a first adhesive material layer. The second semiconductor die is attached to the mold body within a second recess of the at least two recesses by a second adhesive material layer. Each first electrical connection of the plurality of first electrical connections electrically couples a respective first lead of the plurality of first leads to at least one of the first semiconductor die and the second semiconductor die.

One example of a method for fabricating a semiconductor package includes providing a pre-molded lead frame including a mold body including a first main surface and a second main surface opposite to the first main surface, a plurality of recesses within the mold body extending from the first main surface into the mold body, and a plurality of leads coupled to the mold body. The method further includes attaching a plurality of semiconductor dies to the pre-molded lead frame, each semiconductor die of the plurality of semiconductor dies directly attached via a respective adhesive material layer to the mold body within a respective recess of the plurality of recesses. The method further includes electrically connecting each lead of the plurality of leads to a semiconductor die of the plurality of semiconductor dies via a respective electrical connection of a plurality of electrical connections. The method further includes at least partially enclosing the plurality of semiconductor dies and the plurality of electrical connections.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Figure 1A:
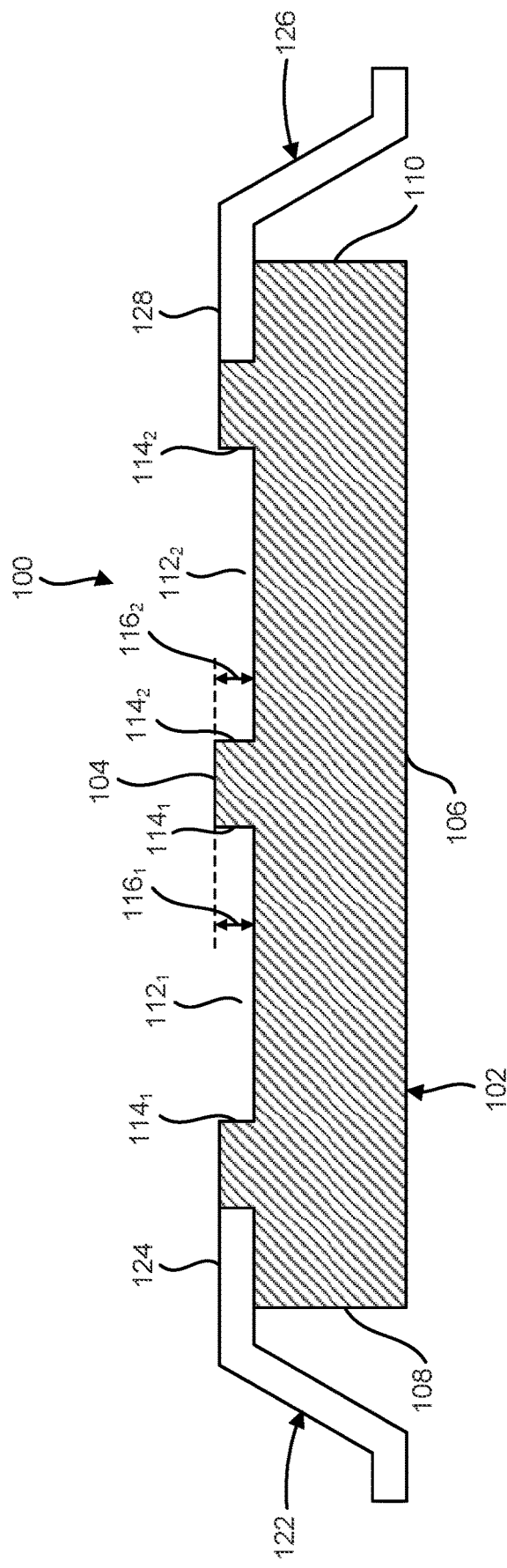
FIGS. 1A and 1B illustrate a cross-sectional view and a top view, respectively, of one example of a pre-molded lead frame.
Figure 1B:
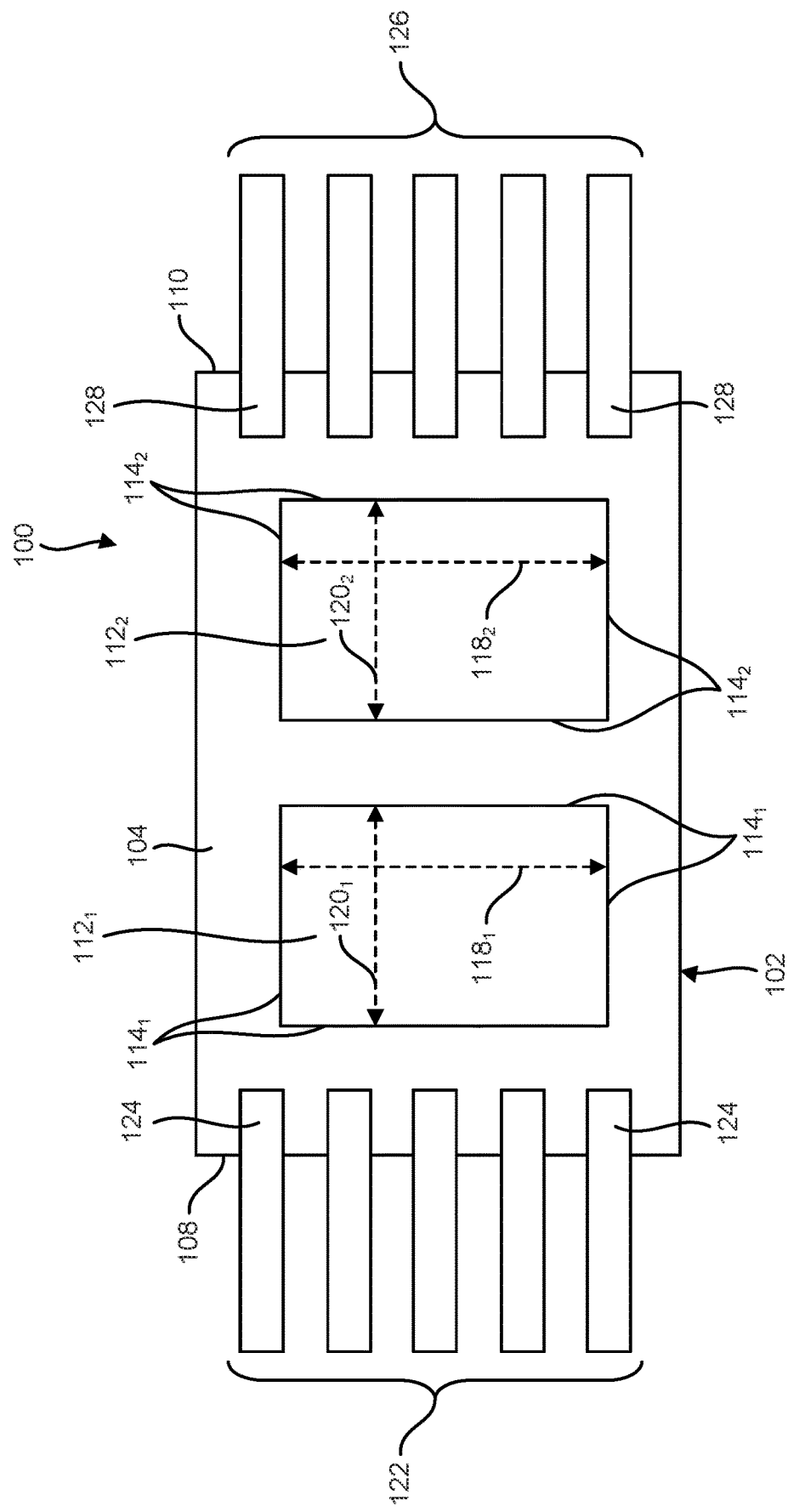

FIGS. 1A and 1B illustrate a cross-sectional view and a top view, respectively, of one example of a pre-molded lead frame 100. Pre-molded lead frame 100 includes a mold body 102, a plurality of recesses $112_1$ to $112_2$, a plurality of first leads 122, and a plurality of second leads 126. In other examples, the plurality of second leads 126 may be excluded. The mold body 102 includes a first main surface 104 (e.g., a top surface) and a second main surface 106 (e.g., a bottom surface) opposite to the first main surface 104. The mold body 102 also includes a third surface 108 (e.g., a side surface) extending between the first main surface 104 and the second main surface 106. The mold body 102 also includes a fourth surface 110 (e.g., a side surface) extending between the first main surface 104 and the second main surface 106. In the illustrated example, the fourth surface 110 is opposite to the third surface 108. The mold body 102 may be made of a mold material including an epoxy or another suitable dielectric material.

Each recess $112_1$ and $112_2$ extends from the first main surface 104 into the mold body 102. The recesses $112_1$ and $112_2$ are separated from each other, from the edges of the mold body 102, and from the first leads 122 and the second leads 126 by portions of the first main surface 104 of the mold body 102. While two recesses $112_1$ and $112_2$ are illustrated in FIGS. 1A and 1B, in other examples pre-molded lead frame 100 may include another suitable number of recesses, such as 3, 4, 5, 6, or more recesses. In one example, as illustrated in FIG. 1A or 1B, each recess $112_1$ and $112_2$ may have a rectangular shape. In other examples, each recess $112_1$ and $112_2$ may have another suitable shape, such as square, circular, etc. While recesses $112_1$ and $112_2$ illustrated in FIGS. 1A and 1B have the same shape and size, in other examples, recesses $112_1$ and $112_2$ may have different shapes and/or sizes. In one example, each recess $112_1$ and $112_2$ includes sidewalls $114_1$ and $114_2$, respectively, perpendicular to the first main surface 104 of the mold body 102. In other examples, each recess $112_1$ and $112_2$ may include sloped sidewalls $114_1$ and $114_2$, respectively, which are not perpendicular to the first main surface 104 of the mold body 102. The mold body 102 between each recess $112_1$ and $112_2$ and the second main surface 106 of the mold body 102 may be devoid of electrically conductive material.

Pre-molded lead frame 100 does not include any die pads and may be devoid of electrically conductive material (e.g., tie bars, etc.) other than leads (e.g., leads 122 and 126). By not including die pads, the clearance requirement between each edge of a semiconductor die and the corresponding edge of a die pad is eliminated. Elimination of the die pads increases the safe isolation distance and reduces the semiconductor package size. In addition, without die pads, the size of the semiconductor dies are not limited by the die pad size.

Each recess $112_1$ and $112_2$ might be configured to receive at least one semiconductor die. A depth $116_1$ of recess $112_1$ may be greater than or equal to a thickness of a semiconductor die to be attached to the mold body 102 within the recess $112_1$. Likewise, a depth $116_2$ of recess $112_2$ may be greater than or equal to a thickness of a semiconductor die to be attached to the mold body 102 within the recess $112_2$. In one example, the depth $116_1$ of recess $112_1$ may be equal to the depth $116_2$ of recess $112_2$. In other examples, the depth $116_1$ of recess $112_1$ may be different from the depth $116_2$ of recess $112_2$. The length $118_1$ and width $120_1$ dimensions of recess $112_1$ are greater than the length and width dimensions, respectively, of the semiconductor die to be attached to the mold body 102 within the recess $112_1$. Likewise, the length $118_2$ and width $120_2$ dimensions of recess $112_2$ are greater than the length and width dimensions, respectively, of the semiconductor die to be attached to the mold body 102 within the recess $112_2$. In one example, the length $118_1$ and width $120_1$ dimensions of recess $112_1$ are equal to the length $118_2$ and width $120_2$ dimensions of recess $112_2$, respectively. In other examples, the length $118_1$ and width $120_1$ dimensions of recess $112_1$ may be different from the length $118_2$ and width $120_2$ dimensions of recess $112_2$, respectively.

The plurality of first leads 122 are coupled to the mold body 102 (e.g., partially embedded in the mold material of the mold body 102) and extend from the third surface 108 (e.g., at the top portion of the third surface 108) of the mold body 102. The plurality of second leads 126 are coupled to the mold body 102 (e.g., partially embedded in the mold material of the mold body 102) and extend from the fourth surface 110 (e.g., at the top portion of the fourth surface 110) of the mold body 102. While five first leads 122 are illustrated in FIG. 1B, in other examples, the plurality of first leads 122 may include another suitable number of leads. While five second leads 126 are illustrated in FIG. 1B, in other examples, the plurality of second leads 126 may include another suitable number of leads. In one example, the number of first leads 122 equals the number of second leads 126. In other examples, the number of first leads 122 may be different from the number of second leads 126. Additional leads (not shown) may extend from other side surfaces of the mold body 102, such as side surfaces extending between the third surface 108 and the fourth surface 110.

Each first lead 122 includes at least a portion of a surface 124 aligned with the first main surface 104 of the mold body 102. In the example illustrated in FIGS. 1A and 1B, the surface 124 of each first lead 122 extends to the edge of the first main surface 104 (e.g., over the third surface 108) of the mold body 102. Likewise, each second lead 126 includes at least a portion of a surface 128 aligned with the first main surface 104 of the mold body 102. In the example illustrated in FIGS. 1A and 1B, the surface 128 of each second lead 126 extends to the edge of the first main surface 104 (e.g., over the fourth surface 110) of the mold body 102. Each first lead 122 and each second lead 126 may be a gull-wing lead.

Figure 2A:
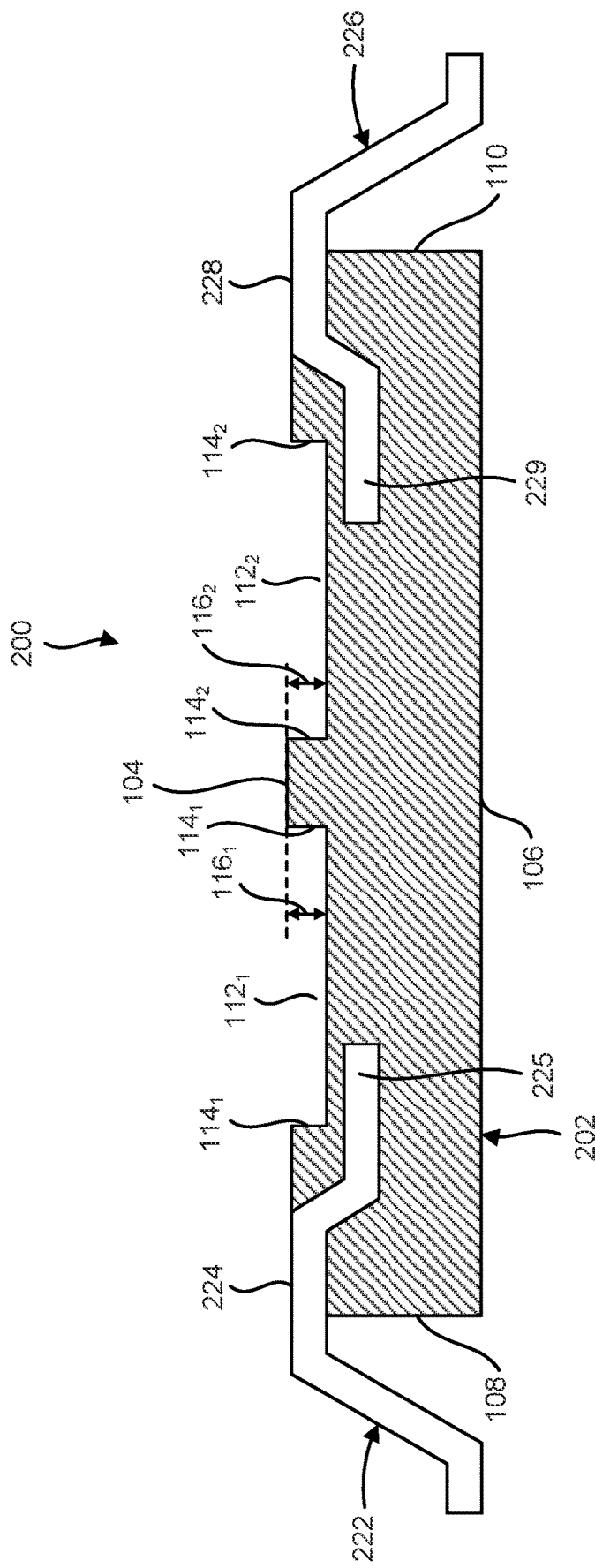
FIGS. 2A and 2B illustrate a cross-sectional view and a top view, respectively, of another example of a pre-molded lead frame.
Figure 2B:
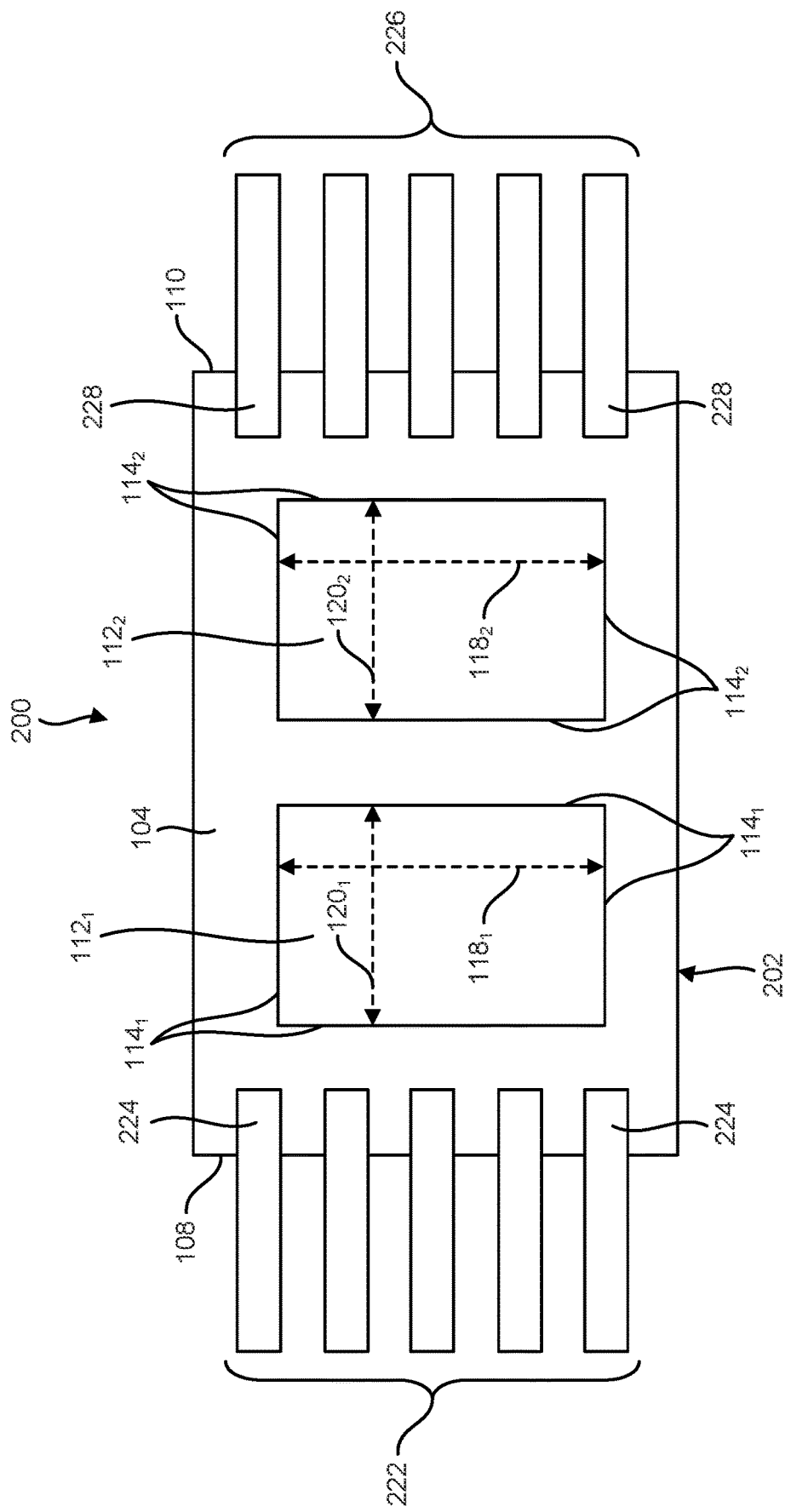

FIGS. 2A and 2B illustrate a cross-sectional view and a top view, respectively, of another example of a pre-molded lead frame 200. Pre-molded lead frame 200 includes a mold body 202, a plurality of recesses $112_1$ to $112_2$ as previously described and illustrated with reference to FIGS. 1A and 1B, a plurality of first leads 222, and a plurality of second leads 226. In other examples, the plurality of second leads 226 may be excluded. The mold body 202 includes a first main surface 104 (e.g., a top surface) and a second main surface 106 (e.g., a bottom surface) opposite to the first main surface 104. The mold body 202 also includes a third surface 108 (e.g., a side surface) extending between the first main surface 104 and the second main surface 106. The mold body 202 also includes a fourth surface 110 (e.g., a side surface) extending between the first main surface 104 and the second main surface 106. In the illustrated example, the fourth surface 110 is opposite to the third surface 108. The mold body 202 may be made of a mold material including an epoxy or another suitable dielectric material.

The plurality of first leads 222 are coupled to the mold body 202 (e.g., partially embedded in the mold material of the mold body 202) and extend from the third surface 108 (e.g., at the top portion of the third surface 108) of the mold body 202. The plurality of second leads 226 are coupled to the mold body 202 (e.g., partially embedded in the mold material of the mold body 202) and extend from the fourth surface 110 (e.g., at the top portion of the fourth surface 110) of the mold body 202. While five first leads 222 are illustrated in FIG. 2B, in other examples, the plurality of first leads 222 may include another suitable number of leads. While five second leads 226 are illustrated in FIG. 2B, in other examples, the plurality of second leads 226 may include another suitable number of leads. In one example, the number of first leads 222 equals the number of second leads 226. In other examples, the number of first leads 222 may be different from the number of second leads 226.

Additional leads (not shown) may extend from other side surfaces of the mold body 202, such as side surfaces extending between the third surface 108 and the fourth surface 110.

Each first lead 222 includes at least a portion of a surface 224 aligned with the first main surface 104 of the mold body 202. In the example illustrated in FIGS. 2A and 2B, the surface 224 of each first lead 222 extends to the edge of the first main surface 104 (e.g., over the third surface 108) of the mold body 202. In addition, at least one first lead 222 partially extends below the recess $112_1$ as indicated at 225 within the mold body 202. Likewise, each second lead 226 includes at least a portion of a surface 228 aligned with the first main surface 104 of the mold body 202. In the example illustrated in FIGS. 2A and 2B, the surface 228 of each second lead 226 extends to the edge of the first main surface 104 (e.g., over the fourth surface 110) of the mold body 202. In addition, at least one second lead 226 partially extends below the recess $112_2$ as indicated at 229 within the mold body 202. Each first lead 222 and each second lead 226 may be a gull-wing lead.

Figure 3A:
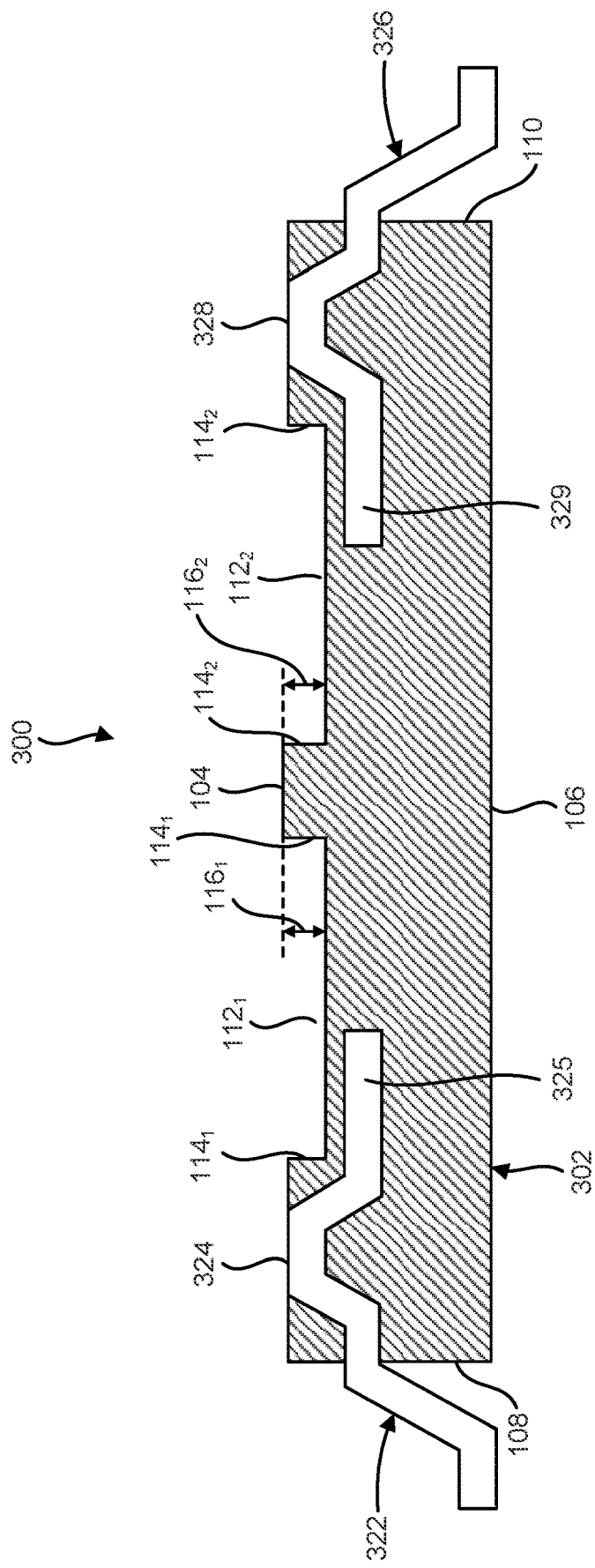
FIGS. 3A and 3B illustrate a cross-sectional view and a top view, respectively, of another example of a pre-molded lead frame.
Figure 3B:
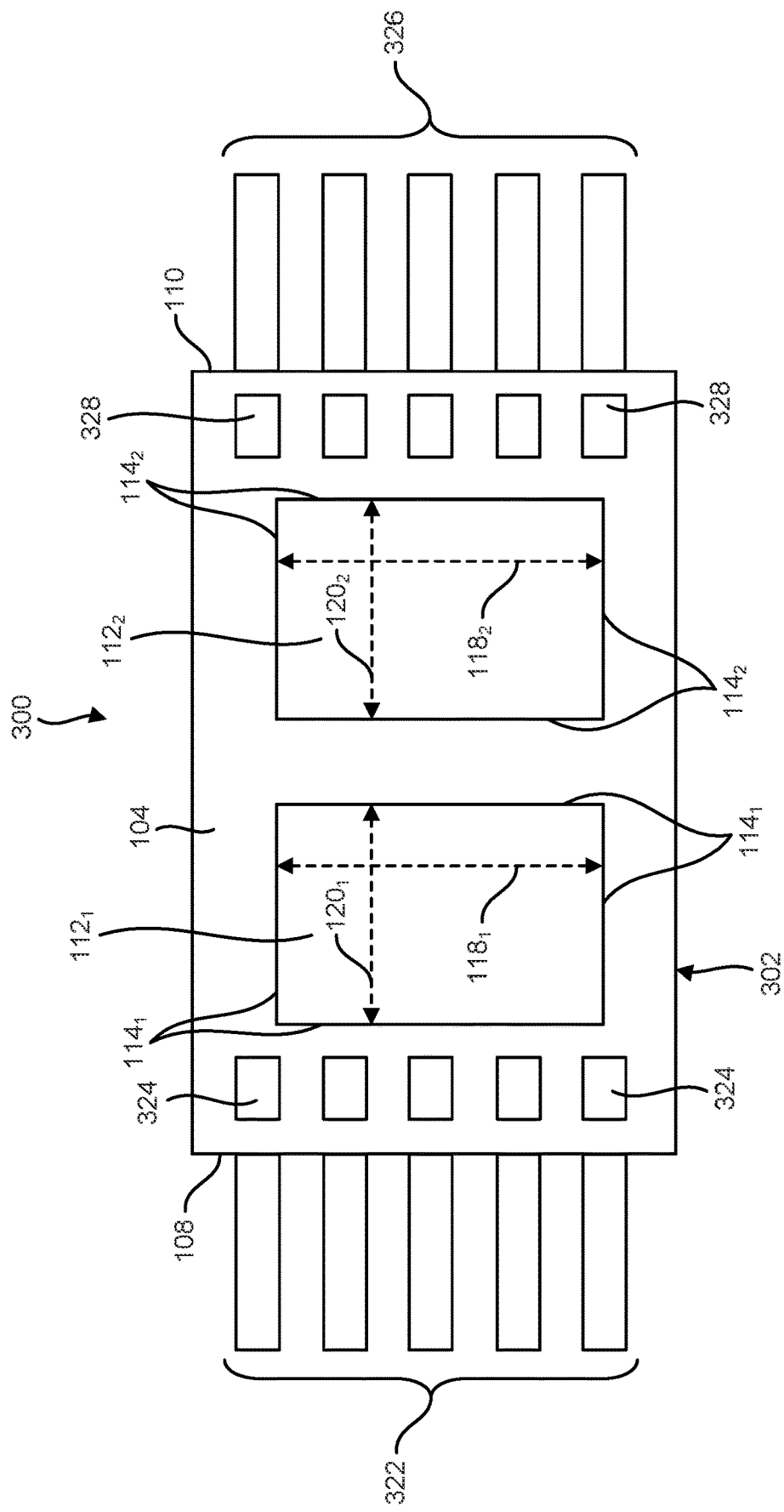

FIGS. 3A and 3B illustrate a cross-sectional view and a top view, respectively, of another example of a pre-molded lead frame 300. Pre-molded lead frame 300 includes a mold body 302, a plurality of recesses $112_1$ to $112_2$ as previously described and illustrated with reference to FIGS. 1A and 1B, a plurality of first leads 322, and a plurality of second leads 326. In other examples, the plurality of second leads 326 may be excluded. The mold body 302 includes a first main surface 104 (e.g., a top surface) and a second main surface 106 (e.g., a bottom surface) opposite to the first main surface 104. The mold body 302 also includes a third surface 108 (e.g., a side surface) extending between the first main surface 104 and the second main surface 106. The mold body 302 also includes a fourth surface 110 (e.g., a side surface) extending between the first main surface 104 and the second main surface 106. In the illustrated example, the fourth surface 110 is opposite to the third surface 108. The mold body 302 may be made of a mold material including an epoxy or another suitable dielectric material.

The plurality of first leads 322 are coupled to the mold body 302 (e.g., partially embedded in the mold material of the mold body 302) and extend from the third surface 108 (e.g., from a central portion of the third surface 108) of the mold body 302. The plurality of second leads 326 are coupled to the mold body 302 (e.g., partially embedded in the mold material of the mold body 302) and extend from the fourth surface 110 (e.g., from a central portion of the fourth surface 110) of the mold body 302. While five first leads 322 are illustrated in FIG. 3B, in other examples, the plurality of first leads 322 may include another suitable number of leads. While five second leads 326 are illustrated in FIG. 3B, in other examples, the plurality of second leads 326 may include another suitable number of leads. In one example, the number of first leads 322 equals the number of second leads 326. In other examples, the number of first leads 322 may be different from the number of second leads 326. Additional leads (not shown) may extend from other side surfaces of the mold body 302, such as side surfaces extending between the third surface 108 and the fourth surface 110.

Each first lead 322 includes at least a portion of a surface 324 aligned with the first main surface 104 of the mold body 302. In the example illustrated in FIGS. 3A and 3B, the surface 324 of each first lead 322 does not extend to the edge of the first main surface 104 (e.g., each surface 324 is surrounded by portions of the first main surface 104) of the mold body 302. In addition, at least one first lead 322 partially extends below the recess $112_1$ as indicated at 325 within the mold body 302. Likewise, each second lead 326 includes at least a portion of a surface 328 aligned with the first main surface 104 of the mold body 302. In the example illustrated in FIGS. 3A and 3B, the surface 328 of each second lead 326 does not extend to the edge of the first main surface 104 (e.g., each surface 328 is surrounded by portions of the first main surface 104) of the mold body 302. In addition, at least one second lead 326 partially extends below the recess $112_2$ as indicated at 329 within the mold body 302. Each first lead 322 and each second lead 326 may be a gull-wing lead.

Figure 4:
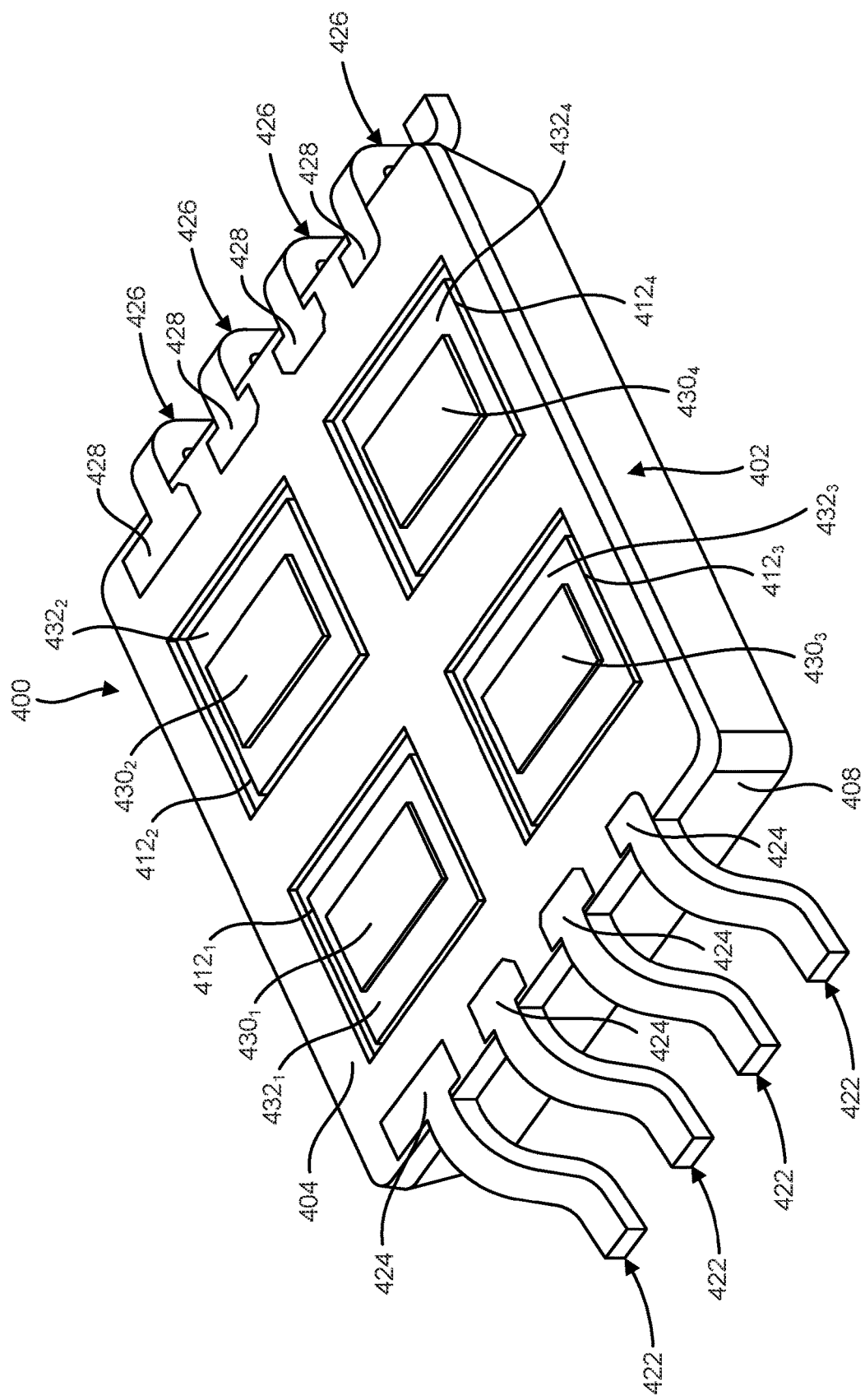
FIG. 4 illustrates a perspective view of one example of a pre-molded lead frame and a plurality of semiconductor dies attached to the pre-molded lead frame.

FIG. 4 illustrates a perspective view of one example of a pre-molded lead frame 400 and a plurality of semiconductor dies $430_1$ to $430_4$ attached to the pre-molded lead frame 400. Pre-molded lead frame 400 includes a mold body 402, a plurality of recesses $412_1$ to $412_4$, a plurality of first leads 422, and a plurality of second leads 426. The mold body 402 includes a first main surface 404 (e.g., a top surface) and a second main surface (e.g., a bottom surface not visible in FIG. 4) opposite to the first main surface 404. The mold body 402 also includes a third surface 408 (e.g., a side surface) extending between the first main surface 404 and the second main surface. The mold body 402 also includes a fourth surface (e.g., a side surface not visible in FIG. 4) opposite to the third surface 408 and extending between the first main surface 404 and the second main surface. The mold body 402 may be made of a mold material including an epoxy or another suitable dielectric material.

Each recess $412_1$ to $412_4$ extends from the first main surface 404 into the mold body 402. In this example, each recess $412_1$ to $412_4$ has a rectangular shape. Pre-molded lead frame 400 does not include any die pads and may be devoid of electrically conductive material (e.g., tie bars, etc.) other than leads (e.g., leads 422 and 426). A semiconductor die $430_1$ to $430_4$ is attached to the mold body 402 within each recess $412_1$ to $412_2$ by an adhesive material (e.g., glue) layer $432_1$ to $432_4$, respectively. As illustrated in FIG. 4, each recess $412_1$ to $412_4$ contains the adhesive material layer $432_1$ to $432_4$, respectively. Thus, the adhesive material layers $432_1$ to $432_4$ are prevented from spreading over the first main surface 404 of the mold body 402.

The plurality of first leads 422 are coupled to the mold body 402 (e.g., partially embedded in the mold material of the mold body 402) and extend from the third surface 408 of the mold body 402. The plurality of second leads 426 are coupled to the mold body 402 (e.g., partially embedded in the mold material of the mold body 402) and extend from the fourth surface of the mold body 402. While four first leads 422 are illustrated in FIG. 4, in other examples, the plurality of first leads 422 may include another suitable number of leads. While four second leads 426 are illustrated in FIG. 4, in other examples, the plurality of second leads 426 may include another suitable number of leads. In this example, the number of first leads 422 equals the number of second leads 426. In other examples, the number of first leads 422 may be different from the number of second leads 426. Additional leads (not shown) may extend from other side surfaces of the mold body 402, such as side surfaces extending between the third surface 408 and the fourth surface. Each first lead 422 includes at least a portion of a surface 424 aligned with the first main surface 404 of the mold body 402. Likewise, each second lead 426 includes at least a portion of a surface 428 aligned with the first main surface 404 of the mold body 402. Each first lead 422 and each second lead 426 may be a gull-wing lead.

Figure 5:
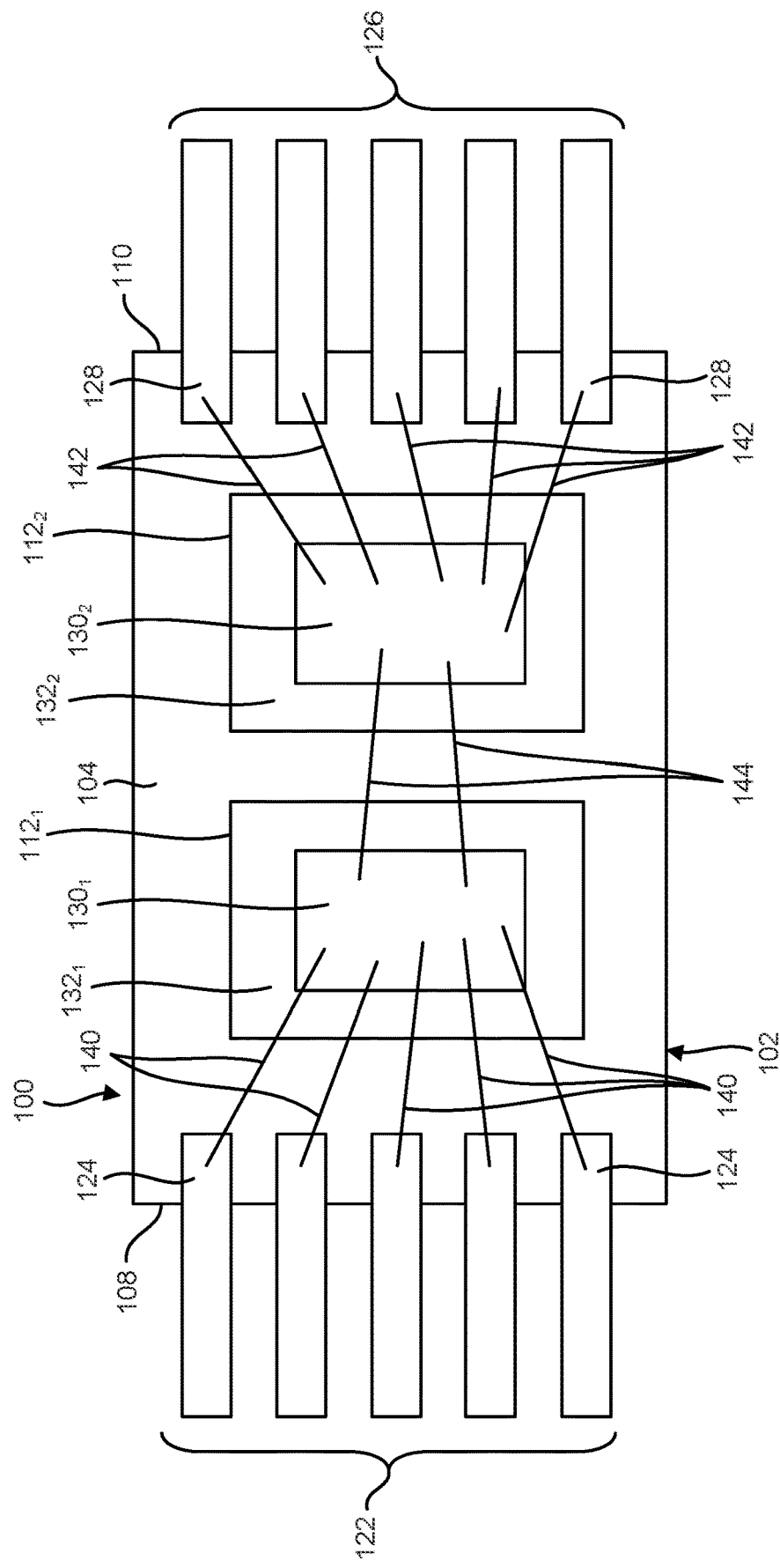
FIG. 5 illustrates a top view of one example of a pre-molded lead frame, a plurality of semiconductor dies attached to the pre-molded lead frame, and a plurality of electrical connections.

FIG. 5 illustrates a top view of one example of a pre-molded lead frame 100 as previously described and illustrated with reference to FIGS. 1A and 1B, a plurality of semiconductor dies $130_1$ to $130_2$ attached to the pre-molded lead frame 100, a plurality of first electrical connections 140, a plurality of second electrical connections 142, and a plurality of third electrical connections 144. Each semiconductor die $130_1$ and $130_2$ is attached to the mold body 102 within a recess $112_1$ and $112_2$ by an adhesive material (e.g., glue) layer $132_1$ and $132_2$, respectively. In this example, each first electrical connection 140 electrically couples a respective first lead 122 (e.g., via a respective surface 124) to the semiconductor die $130_1$. In other examples, each first electrical connection 140 electrically couples a respective first lead 122 to at least one of the semiconductor dies $130_1$ and $130_2$. In this example, each second electrical connection 142 electrically couples a respective second lead 126 (e.g., via a respective surface 128) to the semiconductor die $130_2$. In other examples, each second electrical connection 142 electrically couples a respective second lead 126 to at least one of the semiconductor dies $130_1$ and $130_2$. Each third electrical connection 144 electrically couples the semiconductor die $130_1$ to the semiconductor die $130_2$. Each electrical connection 140, 142, and 144 may include a bond wire, a clip, or another suitable electrical connection. The top view illustrated in FIG. 5 is also applicable to pre-molded lead frame 200 previously described and illustrated with reference to FIGS. 2A and 2B.

Figure 6:
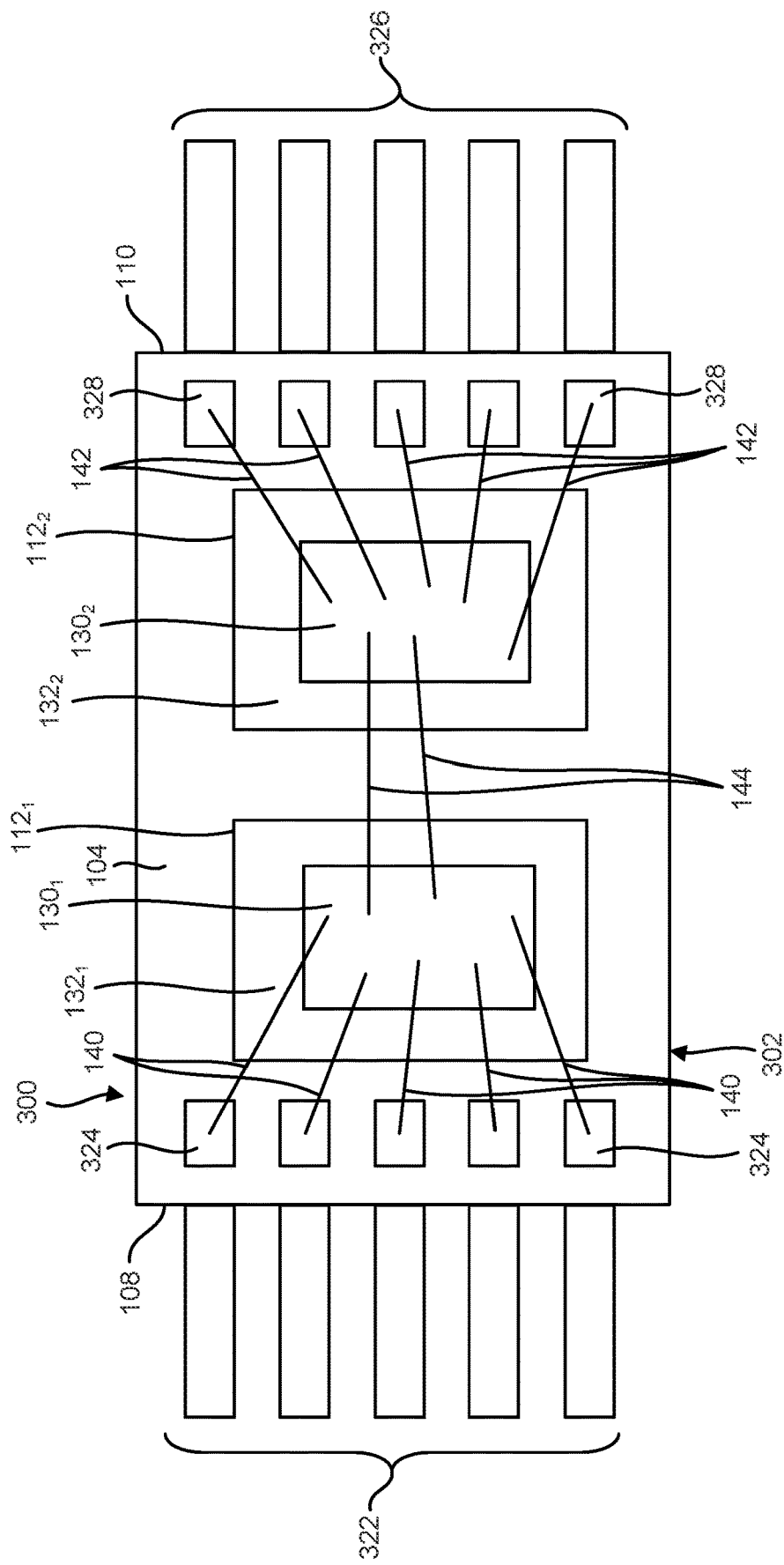
FIG. 6 illustrates a top view of another example of a pre-molded lead frame, a plurality of semiconductor dies attached to the pre-molded lead frame, and a plurality of electrical connections.

FIG. 6 illustrates a top view of one example of a pre-molded lead frame 300 as previously described and illustrated with reference to FIGS. 3A and 3B, a plurality of semiconductor dies $130_1$ to $130_2$ attached to the pre-molded lead frame 300, a plurality of first electrical connections 140, a plurality of second electrical connections 142, and a plurality of third electrical connections 144. Each semiconductor die $130_1$ and $130_2$ is attached to the mold body 302 within a recess $112_1$ and $112_2$ by an adhesive material (e.g., glue) layer $132_1$ and $132_2$, respectively. In this example, each first electrical connection 140 electrically couples a respective first lead 322 (e.g., via a respective surface 324) to the semiconductor die $130_1$. In other examples, each first electrical connection 140 electrically couples a respective first lead 322 to at least one of the semiconductor dies $130_1$ and $130_2$. In this example, each second electrical connection 142 electrically couples a respective second lead 326 (e.g., via a respective surface 328) to the semiconductor die $130_2$. In other examples, each second electrical connection 142 electrically couples a respective second lead 326 to at least one of the semiconductor dies $130_1$ and $130_2$. Each third electrical connection 144 electrically couples the semiconductor die $130_1$ to the semiconductor die $130_2$. Each electrical connection 140, 142, and 144 may include a bond wire, a clip, or another suitable electrical connection.

Figure 7A:
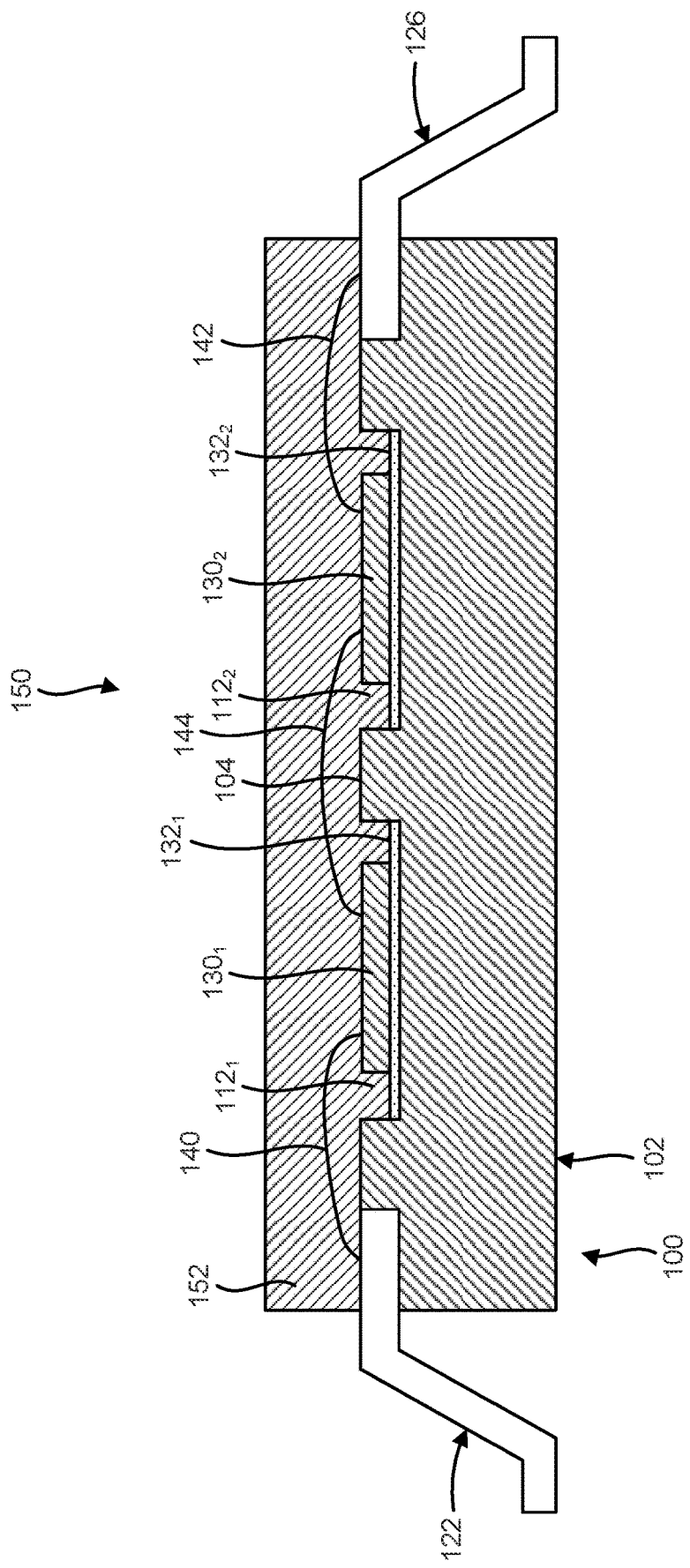
FIGS. 7A and 7B illustrate cross-sectional views of example semiconductor packages including the pre-molded lead frame of FIGS. 1A and 1B.

FIG. 7A illustrates a cross-sectional view of one example of a semiconductor package 150. Semiconductor package 150 includes a pre-molded lead frame 100 as previously described and illustrated with reference to FIGS. 1A and 1B and semiconductor dies $130_1$ and $130_2$, adhesive material layers $132_1$ and $132_2$, and electrical connections 140, 142, and 144 as previously described and illustrated with reference to FIG. 5. In addition, semiconductor package 150 includes a mold material 152 at least partially encapsulating the pre-molded lead frame 100, the semiconductor dies $130_1$ and $130_2$, the adhesive material layers $132_1$ and $132_2$, and the electrical connections 140, 142, and 144. The mold material 152 may be applied on the first main surface 104 of the pre-molded lead frame 100 and fill the portions of recesses $112_1$ and $112_2$ not occupied by the semiconductor dies $130_1$ and $130_2$ and the adhesive material layers $132_1$ and $132_2$, respectively. The mold material 152 may be an epoxy or another suitable dielectric material. In one example, the mold material 152 may be the same mold material used to make the mold body 102. In other examples, the mold material 152 may be different from the mold material used to make the mold body 102.

Figure 7B:
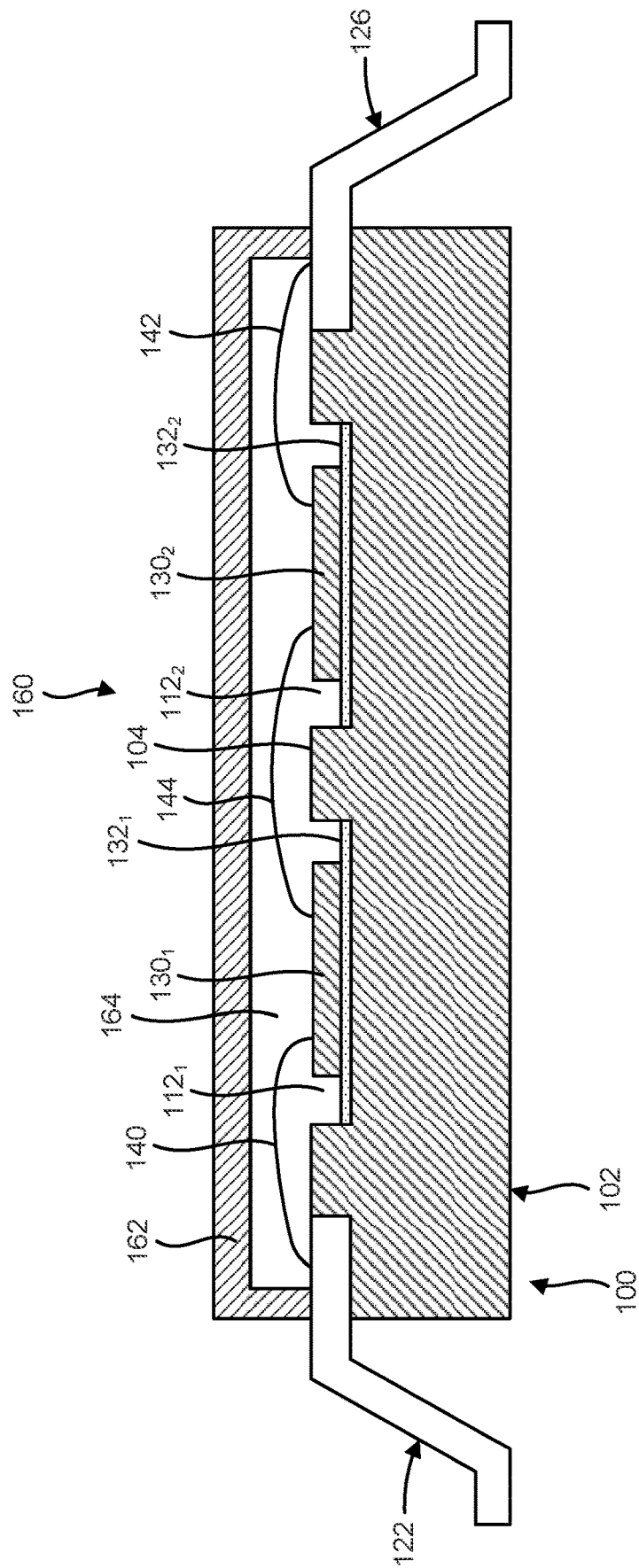

FIG. 7B illustrates a cross-sectional view of another example of a semiconductor package 160. Semiconductor package 160 includes a pre-molded lead frame 100 as previously described and illustrated with reference to FIGS. 1A and 1B and semiconductor dies $130_1$ and $130_2$, adhesive material layers $132_1$ and $132_2$, and electrical connections 140, 142, and 144 as previously described and illustrated with reference to FIG. 5. In addition, semiconductor package 160 includes a pre-molded cap 162 attached to the pre-molded lead frame 100 (e.g., to the first main surface 104) over the semiconductor dies $130_1$ and $130_2$ and the electrical connections 140, 142, and 144 to form at least one cavity 164 surrounding at least one of the semiconductor dies $130_1$ and $130_2$. In this example, at least one of the semiconductor dies $130_1$ and $130_2$ may be a microelectromechanical system (MEMS) device or a sensor. The pre-molded cap 162 may be made of a mold material, such as an epoxy or another suitable dielectric material. In one example, the pre-molded cap 162 may be made of the same mold material as mold body 102. In other examples, the pre-molded cap 162 may be made of a material different from the mold material used to make the mold body 102.

Figure 8A:
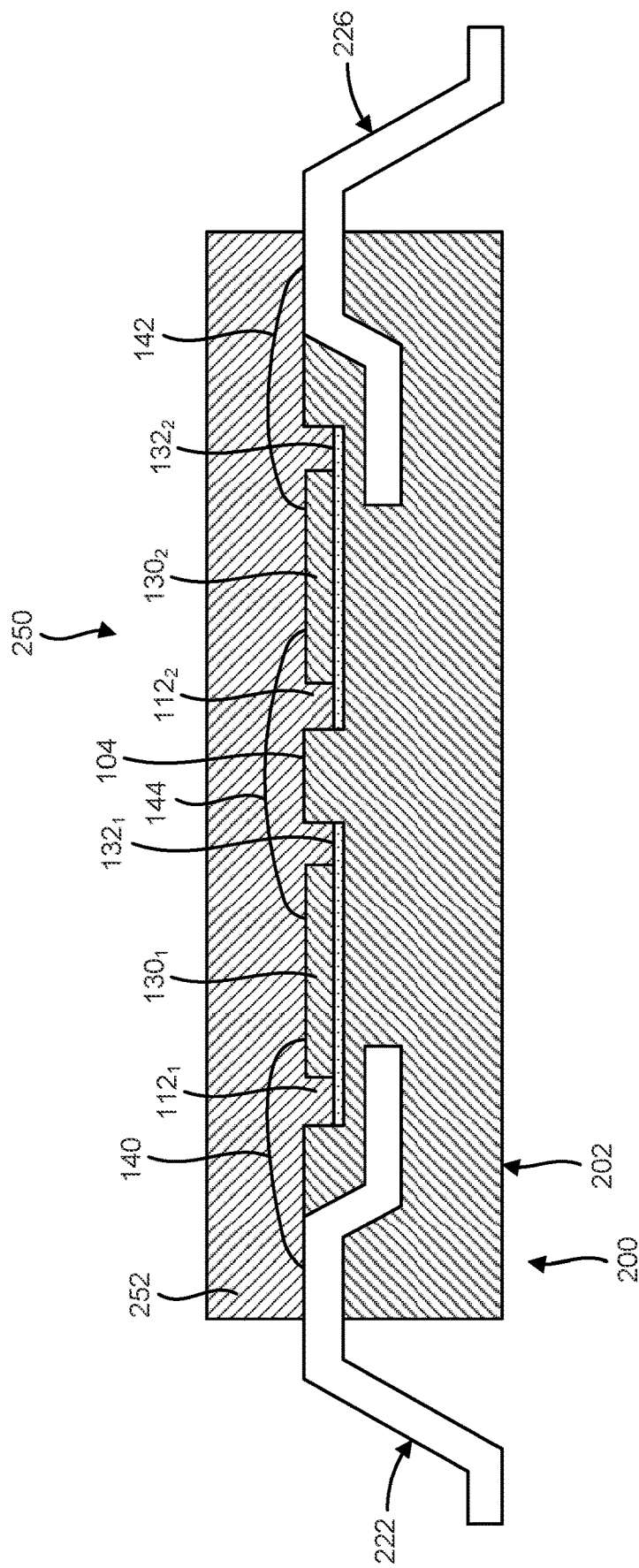
FIGS. 8A and 8B illustrate cross-sectional views of example semiconductor packages including the pre-molded lead frame of FIGS. 2A and 2B.

FIG. 8A illustrates a cross-sectional view of another example of a semiconductor package 250. Semiconductor package 250 includes a pre-molded lead frame 200 as previously described and illustrated with reference to FIGS. 2A and 2B and semiconductor dies $130_1$ and $130_2$, adhesive material layers $132_1$ and $132_2$, and electrical connections 140, 142, and 144 as previously described and illustrated with reference to FIG. 5. In addition, semiconductor package 250 includes a mold material 252 at least partially encapsulating the pre-molded lead frame 200, the semiconductor dies $130_1$ and $130_2$, the adhesive material layers $132_1$ and $132_2$, and the electrical connections 140, 142, and 144. The mold material 252 may be applied on the first main surface 104 of the pre-molded lead frame 200 and fill the portions of recesses $112_1$ and $112_2$ not occupied by the semiconductor dies $130_1$ and $130_2$ and the adhesive material layers $132_1$ and $132_2$, respectively. The mold material 252 may be an epoxy or another suitable dielectric material. In one example, the mold material 252 may be the same mold material used to make the mold body 202. In other examples, the mold material 252 may be different from the mold material used to make the mold body 202.

Figure 8B:
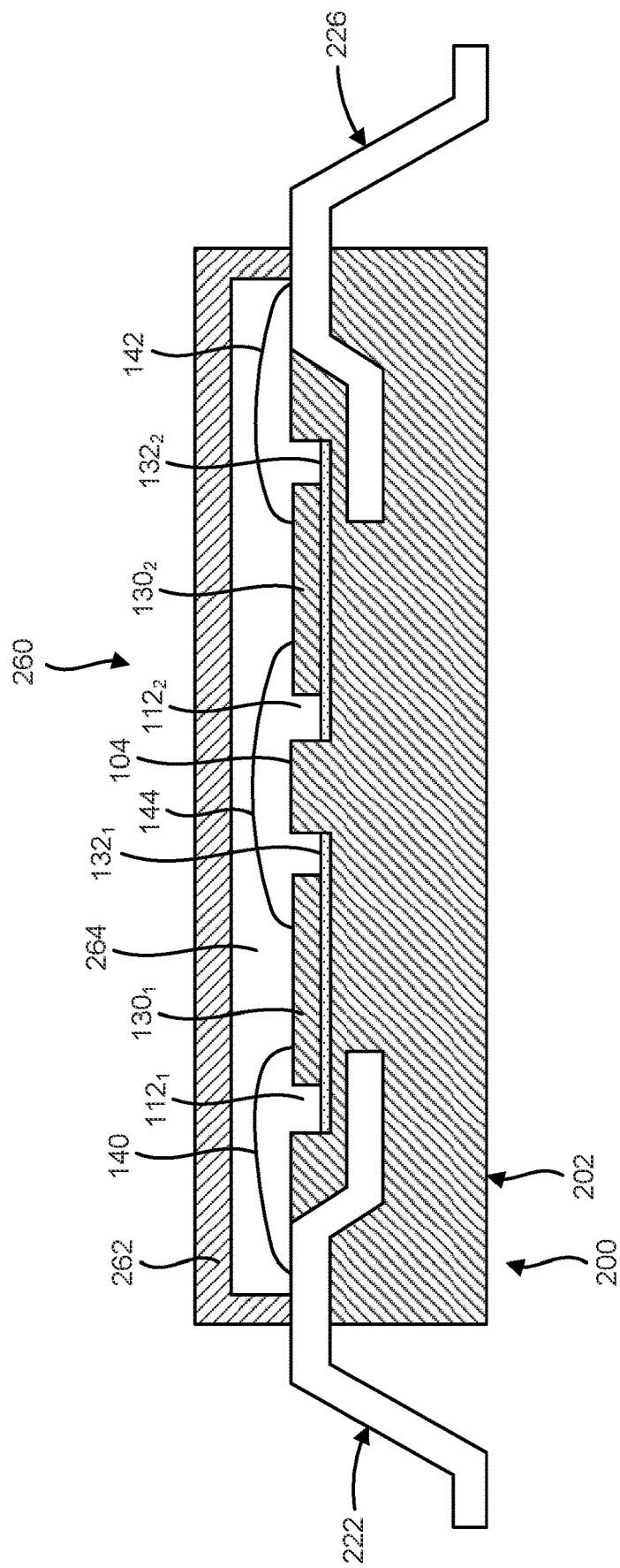

FIG. 8B illustrates a cross-sectional view of another example of a semiconductor package 260. Semiconductor package 260 includes a pre-molded lead frame 200 as previously described and illustrated with reference to FIGS. 2A and 2B and semiconductor dies $130_1$ and $130_2$, adhesive material layers $132_1$ and $132_2$, and electrical connections 140, 142, and 144 as previously described and illustrated with reference to FIG. 5. In addition, semiconductor package 260 includes a pre-molded cap 262 attached to the pre-molded lead frame 200 (e.g., to the first main surface 104) over the semiconductor dies $130_1$ and $130_2$ and the electrical connections 140, 142, and 144 to form at least one cavity 264 surrounding at least one of the semiconductor dies $130_1$ and $130_2$. In this example, at least one of the semiconductor dies $130_1$ and $130_2$ may be a MEMS device or a sensor. The pre-molded cap 262 may be made of a mold material, such as an epoxy or another suitable dielectric material. In one example, the pre-molded cap 262 may be made of the same mold material as mold body 202. In other examples, the pre-molded cap 262 may be made of a material different from the mold material used to make the mold body 202.

Figure 9A:
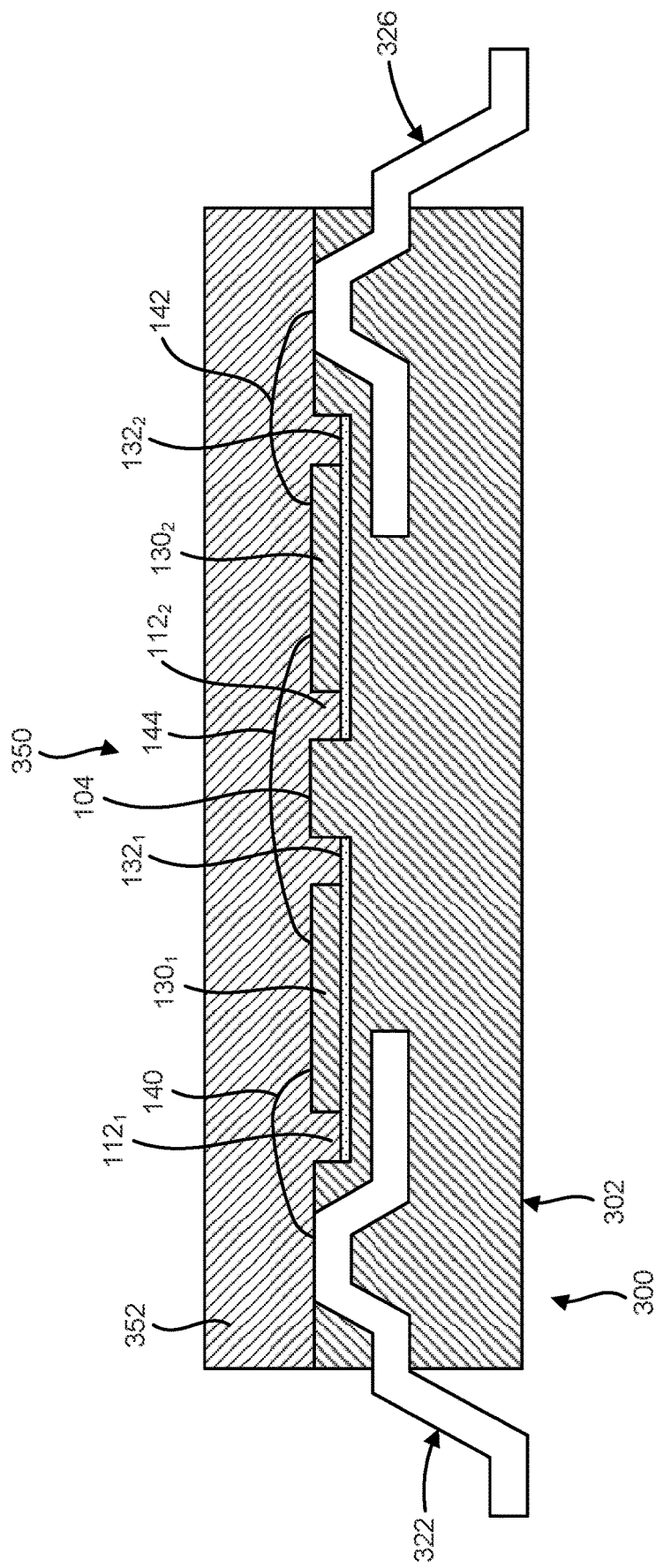
FIGS. 9A and 9B illustrate cross-sectional views of example semiconductor packages including the pre-molded lead frame of FIGS. 3A and 3B.

FIG. 9A illustrates a cross-sectional view of another example of a semiconductor package 350. Semiconductor package 350 includes a pre-molded lead frame 300 as previously described and illustrated with reference to FIGS. 3A and 3B and semiconductor dies $130_1$ and $130_2$, adhesive material layers $132_1$ and $132_2$, and electrical connections 140, 142, and 144 as previously described and illustrated with reference to FIG. 6. In addition, semiconductor package 350 includes a mold material 352 at least partially encapsulating the pre-molded lead frame 300, the semiconductor dies $130_1$ and $130_2$, the adhesive material layers $132_1$ and $132_2$, and the electrical connections 140, 142, and 144. The mold material 352 may be applied on the first main surface 104 of the pre-molded lead frame 300 and fill the portions of recesses $112_1$ and $112_2$ not occupied by the semiconductor dies $130_1$ and $130_2$ and the adhesive material layers $132_1$ and $132_2$, respectively. The mold material 352 may be an epoxy or another suitable dielectric material. In one example, the mold material 352 may be the same mold material used to make the mold body 302. In other examples, the mold material 352 may be different from the mold material used to make the mold body 302.

Figure 9B:
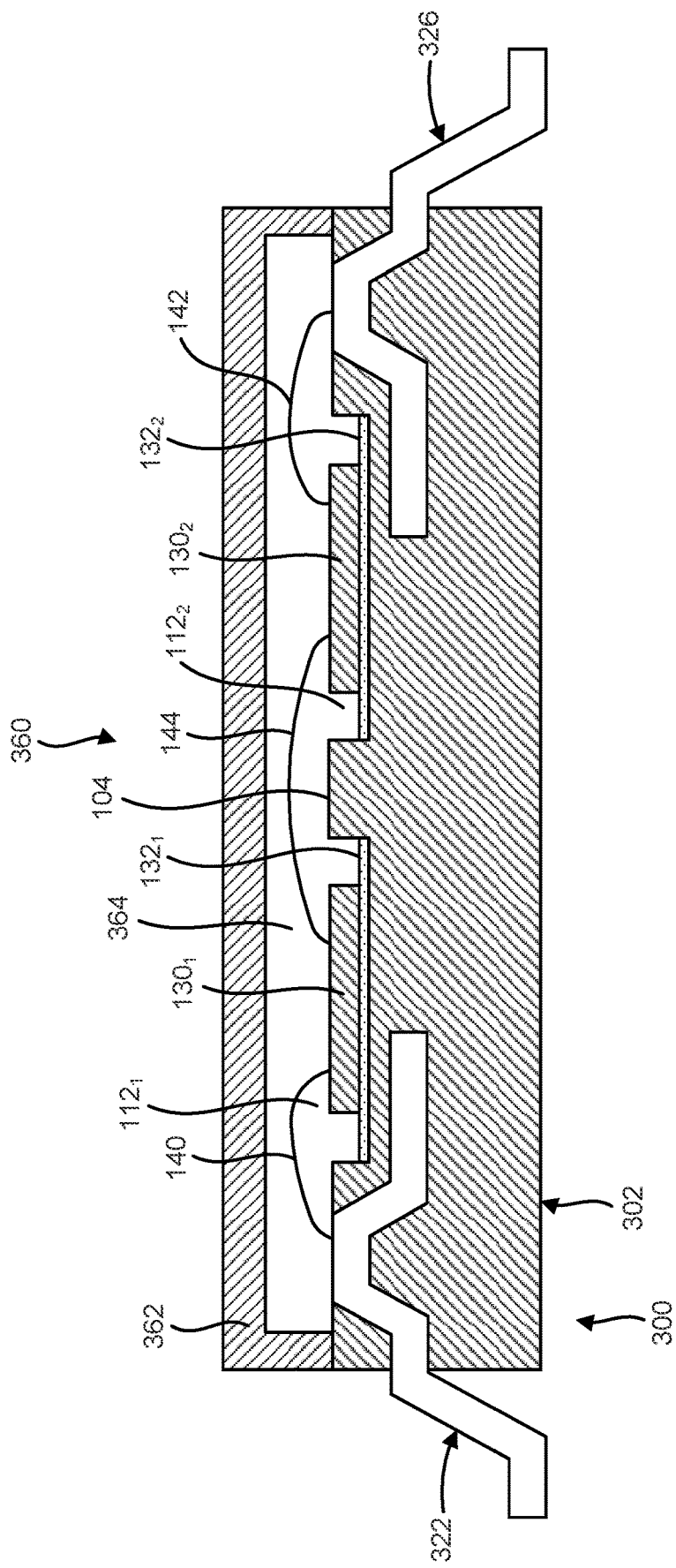

FIG. 9B illustrates a cross-sectional view of another example of a semiconductor package 360. Semiconductor package 360 includes a pre-molded lead frame 300 as previously described and illustrated with reference to FIGS. 3A and 3B and semiconductor dies $130_1$ and $130_2$, adhesive material layers $132_1$ and $132_2$, and electrical connections 140, 142, and 144 as previously described and illustrated with reference to FIG. 6. In addition, semiconductor package 360 includes a pre-molded cap 362 attached to the pre-molded lead frame 300 (e.g., to the first main surface 104) over the semiconductor dies $130_1$ and $130_2$ and the electrical connections 140, 142, and 144 to form at least one cavity 364 surrounding at least one of the semiconductor dies $130_1$ and $130_2$. In this example, at least one of the semiconductor dies $130_1$ and $130_2$ may be a MEMS device or a sensor. The pre-molded cap 362 may be made of a mold material, such as an epoxy or another suitable dielectric material. In one example, the pre-molded cap 362 may be made of the same mold material as mold body 302. In other examples, the pre-molded cap 362 may be made of a material different from the mold material used to make the mold body 302.

Figure 10:
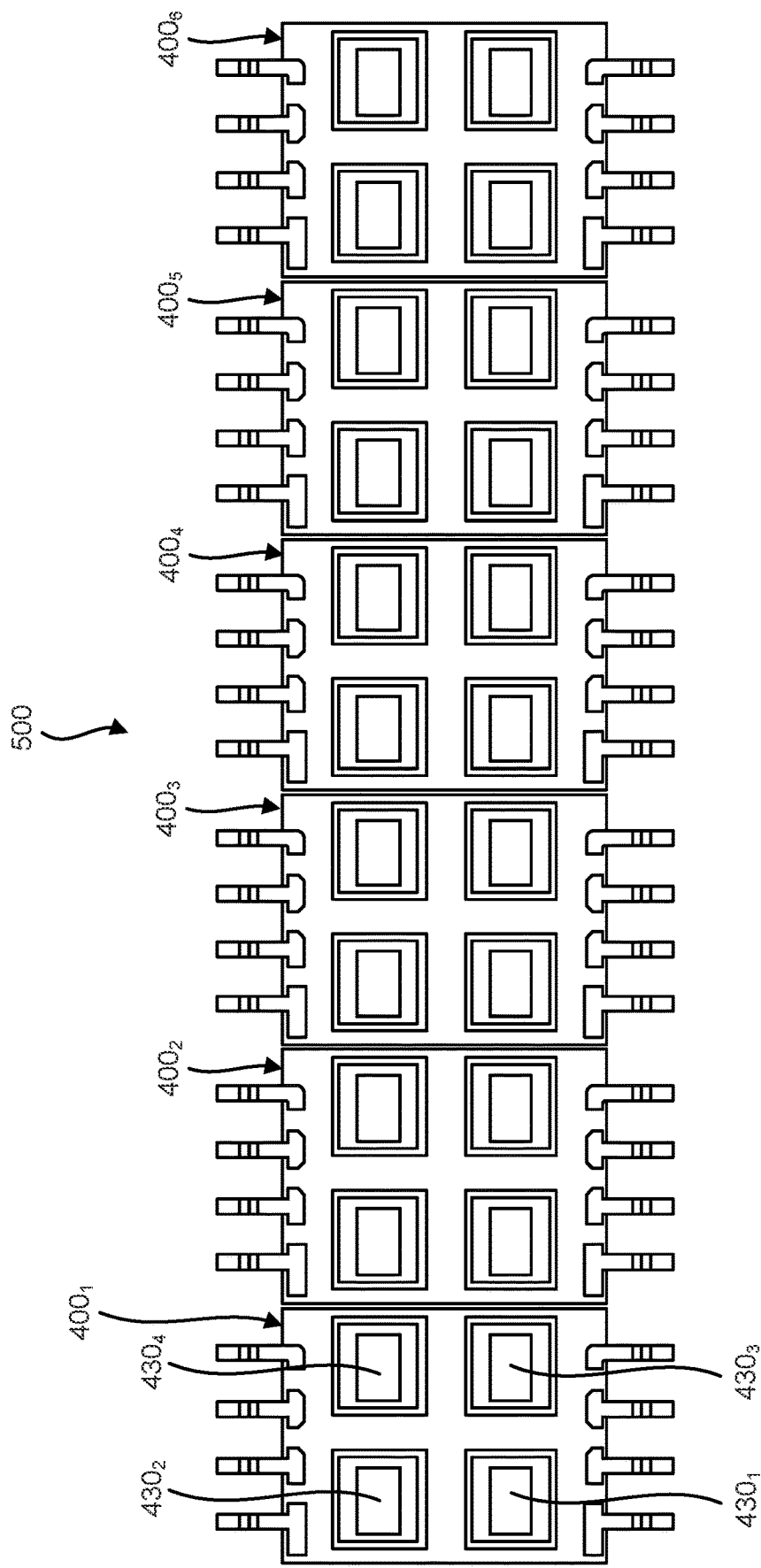
FIG. 10 illustrates a top view of one example of a strip of connected pre-molded lead frames and a plurality of semiconductor dies attached to the strip of connected pre-molded lead frames.

FIG. 10 illustrates a top view of one example of a strip 500 of pre-molded lead frames $400_1$ to $400_6$ and a plurality of semiconductor dies (e.g., semiconductor dies $430_1$ to $430_4$) attached to each pre-molded lead frame $400_1$ to $400_6$. Each pre-molded lead frame $400_1$ to $400_6$ was previously described and illustrated with reference to FIG. 4. While strip 500 includes six pre-molded lead frames connected to each other, in other examples, strip 500 may include less than six pre-molded lead frames or more than six pre-molded lead frames connected to each other. The strip 500 may be singulated at any suitable point in the semiconductor package fabrication process to separate the pre-molded lead frames $400_1$ to $400_6$ from each other.

Figure 11A:
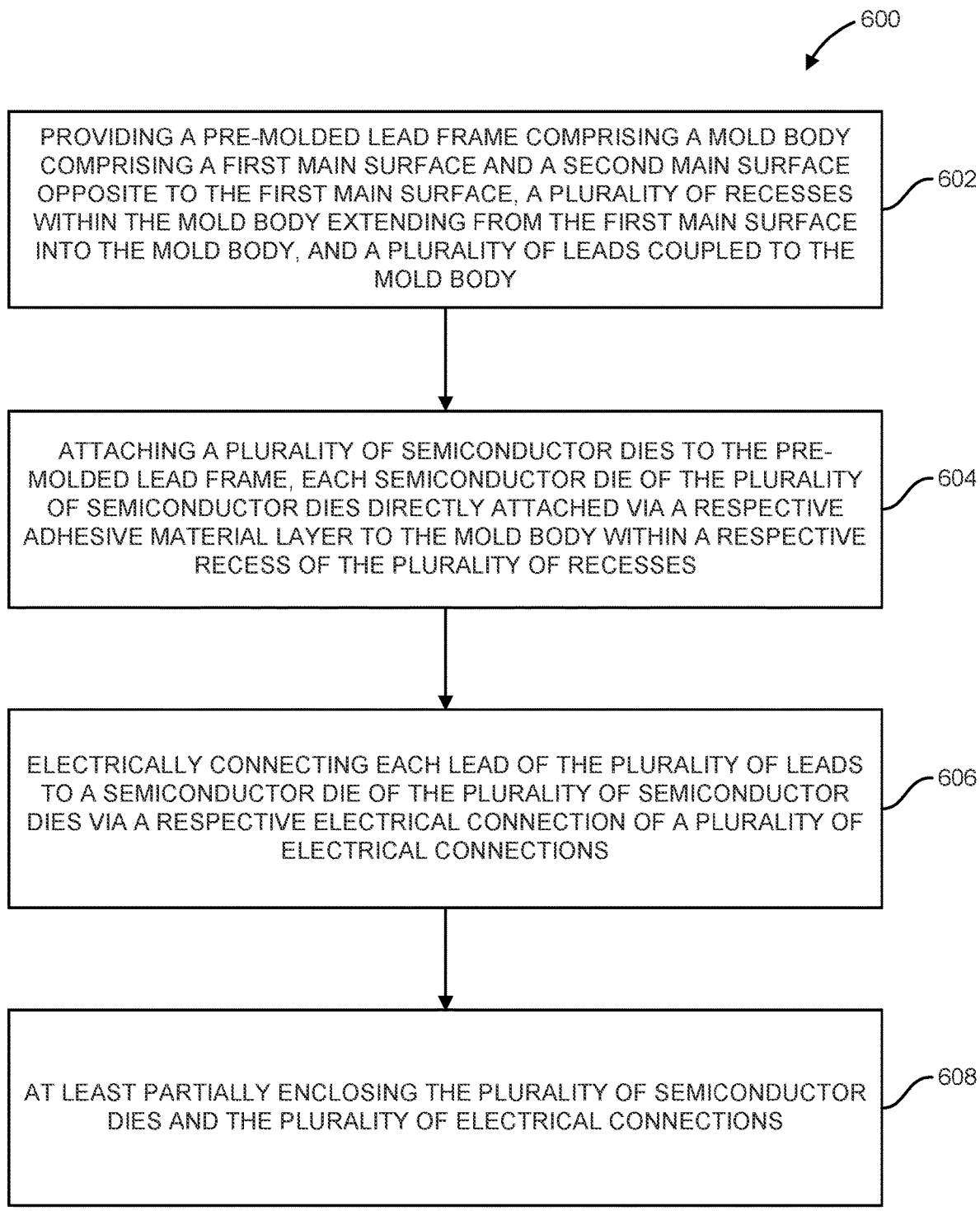
FIGS. 11A and 11B are flow diagrams illustrating one example of a method for fabricating a semiconductor package.
Figure 11B:
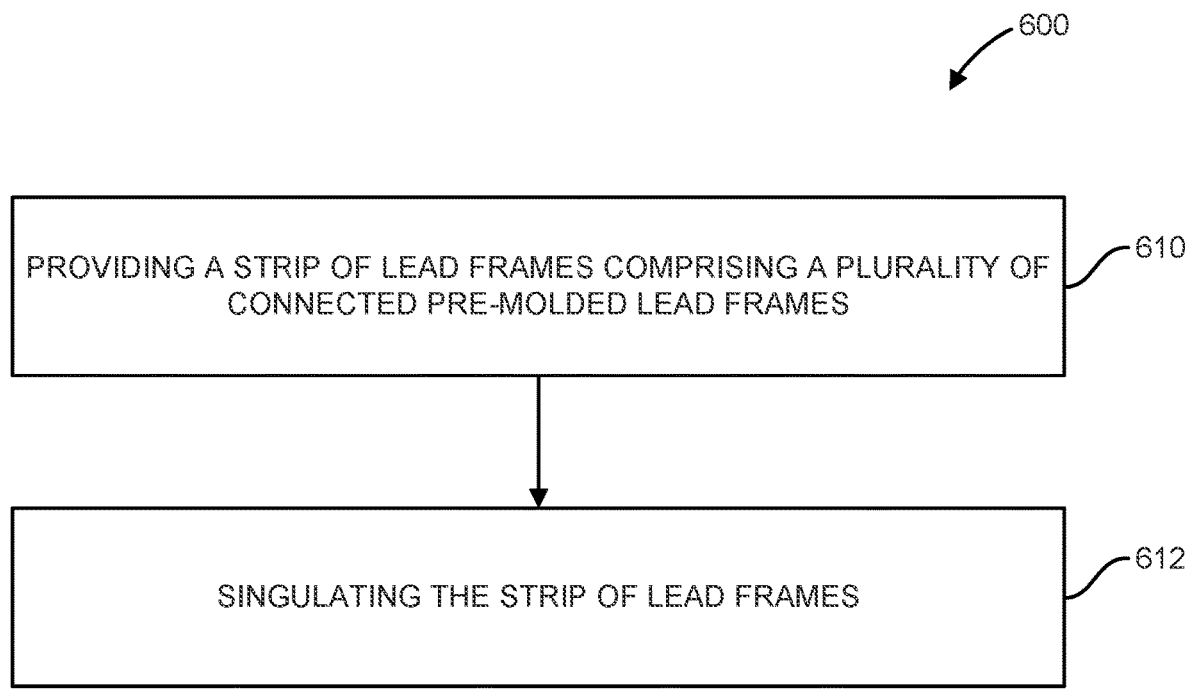

FIGS. 11A and 11B are flow diagrams illustrating one example of a method 600 for fabricating a semiconductor package. As illustrated in FIG. 11A at 602, method 600 includes providing a pre-molded lead frame (e.g., 100, 200, 300, or 400 previously described and illustrated with reference to FIGS. 1A-4) comprising a mold body (e.g., 102, 202, 302, or 402) comprising a first main surface (e.g., 104 or 404) and a second main surface (e.g., 106) opposite to the first main surface, a plurality of recesses (e.g., $112_1$ to $112_2$ or $412_1$ to $412_4$) within the mold body extending from the first main surface into the mold body, and a plurality of leads (e.g., 122, 222, 322, or 422) coupled to the mold body. At 604, method 600 includes attaching a plurality of semiconductor dies (e.g., $130_1$ to $130_2$ or $430_1$ to $430_4$ previously described and illustrated with reference to FIGS. 4-6) to the pre-molded lead frame, each semiconductor die of the plurality of semiconductor dies directly attached via a respective adhesive material layer (e.g., $132_1$ to $132_2$ or $432_1$ to $432_4$) to the mold body within a respective recess of the plurality of recesses. At 606, method 600 includes electrically connecting each lead of the plurality of leads to a semiconductor die of the plurality of semiconductor dies via a respective electrical connection (e.g., 140) of a plurality of electrical connections.

At 608, method 600 includes at least partially enclosing the plurality of semiconductor dies and the plurality of electrical connections. In one example, at least partially enclosing the plurality of semiconductor dies and the plurality of electrical connections comprises encapsulating the plurality of semiconductor dies and the plurality of electrical connections with a mold material (e.g., 152, 252, or 352 previously described and illustrated with reference to FIGS. 7A, 8A, and 9A). In another example, at least partially enclosing the plurality of semiconductor dies and the plurality of electrical connections comprises attaching a pre-molded cap (e.g., 162, 262, or 362 previously described and illustrated with reference to FIGS. 7B, 8B, and 9B) to the pre-molded lead frame over the plurality of semiconductor dies and the plurality of electrical connections.

As illustrated in FIG. 11B at 610, method 600 may further include providing a strip of lead frames (e.g., strip 500 previously described and illustrated with reference to FIG. 10) comprising a plurality of connected pre-molded lead frames. At 612, method 600 may further include singulating the strip of lead frames.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A pre-molded lead frame comprising:
   a mold body comprising a first main surface and a second main surface opposite to the first main surface;
   a plurality of recesses separated from each other by the mold body, each recess of the plurality of recesses extending from the first main surface into the mold body; and
   a plurality of first leads coupled to the mold body and extending from a third surface of the mold body, the third surface extending between the first main surface and the second main surface.

2. The pre-molded lead frame of claim 1, wherein the mold body between each recess of the plurality of recesses and the second main surface of the mold body is devoid of electrically conductive material.

3. The pre-molded lead frame of claim 1, wherein each recess of the plurality of recesses is configured to receive at least one semiconductor die.

4. The pre-molded lead frame of claim 1, wherein at least one first lead of the plurality of first leads partially extends below a recess of the plurality of recesses.

5. The pre-molded lead frame of claim 1, wherein each recess of the plurality of recesses comprises sidewalls perpendicular to the first main surface of the mold body.

6. The pre-molded lead frame of claim 1, further comprising:
a plurality of second leads coupled to the mold body and extending from a fourth surface of the mold body, the fourth surface extending between the first main surface and the second main surface.

7. The pre-molded lead frame of claim 1, wherein each first lead of the plurality of first leads comprises at least a portion of a surface aligned with the first main surface of the mold body.

8. The pre-molded lead frame of claim 1, wherein each of the plurality of first leads comprises a gull-wing lead.

9. The pre-molded lead frame of claim 1, wherein the pre-molded lead frame is devoid of electrically conductive material other than leads.

10. A semiconductor package comprising:
a pre-molded lead frame comprising a mold body comprising a first main surface and a second main surface opposite to the first main surface, at least two recesses separated from each other within the mold body and extending from the first main surface into the mold body, and a plurality of first leads coupled to the mold body;
a first semiconductor die attached to the mold body within a first recess of the at least two recesses by a first adhesive material layer;
a second semiconductor die attached to the mold body within a second recess of the at least two recesses by a second adhesive material layer; and
a plurality of first electrical connections, each first electrical connection of the plurality of first electrical connections electrically coupling a respective first lead of the plurality of first leads to at least one of the first semiconductor die and the second semiconductor die.

11. The semiconductor package of claim 10, wherein at least one first lead of the plurality of first leads partially extends below a recess of the at least two recesses.

12. The semiconductor package of claim 10, further comprising:
a mold material at least partially encapsulating the first semiconductor die, the second semiconductor die, and the plurality of first electrical connections.

13. The semiconductor package of claim 10, further comprising:
a pre-molded cap attached to the pre-molded lead frame over the first semiconductor die, the second semiconductor die, and the plurality of first electrical connections to form at least one cavity surrounding at least one of the first semiconductor die and the second semiconductor die.

14. The semiconductor package of claim 10, wherein a depth of the first recess is greater than or equal to a thickness of the first semiconductor die and a depth of the second recess is greater than or equal to a thickness of the second semiconductor die.

15. The semiconductor package of claim 10, wherein the pre-molded lead frame comprises a plurality of second leads coupled to the mold body opposite to the plurality of first leads, and wherein the semiconductor package further comprises:
a plurality of second electrical connections, each second electrical connection of the plurality of second electrical connections electrically coupling a respective second lead of the plurality of second leads to at least one of the first semiconductor die and the second semiconductor die.

16. The semiconductor package of claim 10, further comprising:
at least one third electrical connection electrically coupling the first semiconductor die to the second semiconductor die.

17. A semiconductor package comprising:
a pre-molded lead frame comprising a mold body comprising a first main surface and a second main surface opposite to the first main surface, at least two recesses within the mold body extending from the first main surface into the mold body, and a plurality of first leads coupled to the mold body;
a first semiconductor die attached to the mold body within a first recess of the at least two recesses by a first adhesive material layer;
a second semiconductor die attached to the mold body within a second recess of the at least two recesses by a second adhesive material layer; and
a plurality of first electrical connections, each first electrical connection of the plurality of first electrical connections electrically coupling a respective first lead of the plurality of first leads to at least one of the first semiconductor die and the second semiconductor die,
wherein a depth of the first recess is greater than or equal to a thickness of the first semiconductor die and a depth of the second recess is greater than or equal to a thickness of the second semiconductor die.

18. The semiconductor package of claim 17, wherein at least one first lead of the plurality of first leads partially extends below a recess of the at least two recesses.

19. The semiconductor package of claim 17, further comprising:
a mold material at least partially encapsulating the first semiconductor die, the second semiconductor die, and the plurality of first electrical connections.

20. The semiconductor package of claim 17, further comprising:
a pre-molded cap attached to the pre-molded lead frame over the first semiconductor die, the second semiconductor die, and the plurality of first electrical connections to form at least one cavity surrounding at least one of the first semiconductor die and the second semiconductor die.

* * * * *